United States Patent
Spring et al.

(10) Patent No.: US 10,551,602 B2
(45) Date of Patent: Feb. 4, 2020

(54) WAFER-LEVEL OPTICAL DEVICE HAVING LIGHT GUIDE PROPERTIES

(71) Applicant: AMS SENSORS SINGAPORE PTE. LTD., Singapore (SG)

(72) Inventors: Nicola Spring, Ziegelbrücke (CH); Hartmut Rudmann, Jona (CH); Markus Rossi, Jona (CH)

(73) Assignee: AMS SENSORS SINGAPORE PTE. LTD., Singapore (SG)

(*) Notice: Subject to any disclaimer, the term of this patent is extended or adjusted under 35 U.S.C. 154(b) by 92 days.

(21) Appl. No.: 15/755,817

(22) PCT Filed: Aug. 24, 2016

(86) PCT No.: PCT/SG2016/050410
§ 371 (c)(1),
(2) Date: Feb. 27, 2018

(87) PCT Pub. No.: WO2017/039535
PCT Pub. Date: Mar. 9, 2017

(65) Prior Publication Data
US 2018/0329187 A1 Nov. 15, 2018

Related U.S. Application Data

(60) Provisional application No. 62/211,474, filed on Aug. 28, 2015.

(51) Int. Cl.
*G02B 17/08* (2006.01)
*H01L 33/48* (2010.01)
(Continued)

(52) U.S. Cl.
CPC .......... *G02B 17/0864* (2013.01); *G02B 6/00* (2013.01); *G02B 6/10* (2013.01); *G02B 6/12* (2013.01);
(Continued)

(58) Field of Classification Search
None
See application file for complete search history.

(56) References Cited

U.S. PATENT DOCUMENTS

| 2013/0286686 | A1* | 10/2013 | Kettunen | G02B 6/0011 362/623 |
| 2014/0295122 | A1* | 10/2014 | Riel | H01L 27/14618 428/54 |
| 2017/0322376 | A1* | 11/2017 | Wu | G02B 6/4239 |

FOREIGN PATENT DOCUMENTS

| WO | 2012/071674 | 6/2012 |
| WO | 2013/049948 | 4/2013 |
| WO | 2016/076797 | 5/2016 |

OTHER PUBLICATIONS

Australian Patent Office, International Search Report for PCT/SG2016/050410 dated Jan. 3, 2017.

* cited by examiner

*Primary Examiner* — Jennifer D. Carruth
(74) *Attorney, Agent, or Firm* — Michael Best & Friedrich LLP

(57) ABSTRACT

An optical device (1) includes two prism bodies (41, 42) and four side panels (71-74) attached to both prism bodies (41, 42). A cavity (9) is thereby enclosed. A first reflector (81) can be present at a first side face (81) of the first prism body (41), and a second reflector (82) can be present at a second side face (82) of the second prism body (42). At least one of the prism bodies (41, 42) and/or at least one of the side panels (71-74) can be at least in part made of a non-transparent dielectric material such as a printed circuit board. In some implementations, an optoelectronic component (90) can be attached to the respective constituent of the optical device (1).

19 Claims, 4 Drawing Sheets

Figure 1:
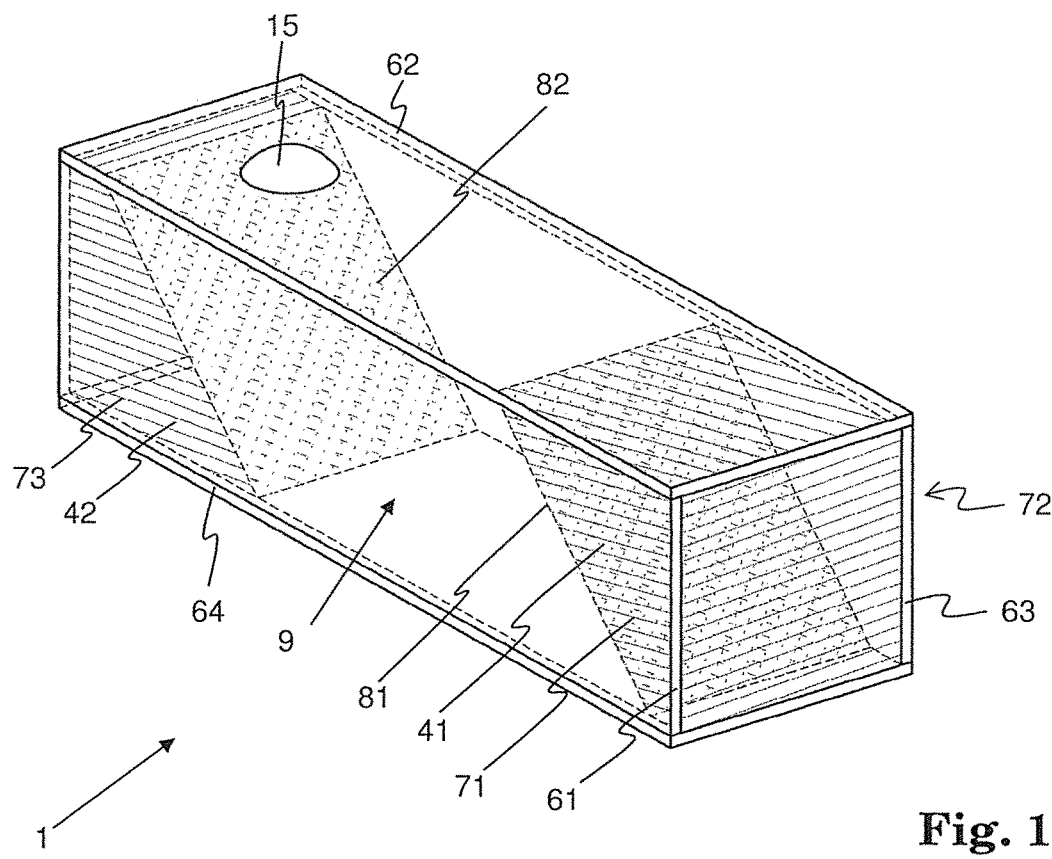

(51) Int. Cl.

| | |
|---|---|
| *H01L 33/60* | (2010.01) |
| *H01L 33/62* | (2010.01) |
| *H05K 1/03* | (2006.01) |
| *G02B 6/42* | (2006.01) |
| *G02B 6/10* | (2006.01) |
| *G02B 6/12* | (2006.01) |
| *G02B 6/00* | (2006.01) |
| *G02B 26/08* | (2006.01) |
| *H01L 31/02* | (2006.01) |
| *H01L 31/0203* | (2014.01) |
| *H01L 31/0232* | (2014.01) |
| *H01L 33/58* | (2010.01) |
| *H05K 1/02* | (2006.01) |
| *H05K 1/11* | (2006.01) |
| *H05K 1/18* | (2006.01) |
| *G02B 19/00* | (2006.01) |

(52) U.S. Cl.
CPC ........... *G02B 6/42* (2013.01); *G02B 26/0833* (2013.01); *H01L 31/0203* (2013.01); *H01L 31/02005* (2013.01); *H01L 31/02327* (2013.01); *H01L 33/486* (2013.01); *H01L 33/58* (2013.01); *H01L 33/60* (2013.01); *H01L 33/62* (2013.01); *H05K 1/0274* (2013.01); *H05K 1/03* (2013.01); *H05K 1/111* (2013.01); *H05K 1/115* (2013.01); *H05K 1/181* (2013.01); *G02B 19/0028* (2013.01); *H05K 2201/10106* (2013.01); *H05K 2201/10121* (2013.01); *H05K 2201/10151* (2013.01); *H05K 2201/2054* (2013.01)

WAFER-LEVEL OPTICAL DEVICE HAVING LIGHT GUIDE PROPERTIES

Implementations of the invention relate to an optical device which can be manufactured on wafer level. The device can be a light guide element or can be an optoelectronic device or both. Such devices can be used, e.g., as light sensors, as light emitters, for light guiding purposes. They can find application, e.g., where particularly small optical devices are required and/or where very high numbers of optical devices are needed.

From WO 2013/049948 A1, light guide elements are known, which can be manufactured on wafer level from a transparent material such as glass or a transparent polymer.

One example of an advantage of a version of the invention is to create an optical device having particularly good manufacturability.

Another example of an advantage of a version of the invention is to create an optical device which can be manufactured in very high numbers.

Another example of an advantage of a version of the is to create an optical device which can be manufactured on wafer level.

Another example of an advantage of a version of the is to create an optical device which can be manufactured in a particularly cost-effective way.

Another example of an advantage of a version of the invention is to provide an optical device of particularly small dimensions.

Another example of an advantage of a version of the invention is to provide an optical device having light guide properties, in particular wherein the optical device is an optoelectronic module.

Another example of an advantage of a version of the is to provide an optical device having light emission and/or light sension properties in addition to light guide properties.

Another example of an advantage of a version of the is to provide a highly integrated optical device.

Further objects and various advantages emerge from the description and embodiments below.

At least one of these objects is at least partially achieved by devices according to the patent claims.

The optical device can include a very small number of constituents. It can include two prism bodies and four side panels attached to both prism bodies each. A cavity is thereby enclosed. A first reflector is present at a first side face of the first prism body, and a second reflector is present at a second side face of the second prism body. At least one of the prism bodies and/or at least one of the side panels is at least in part made of a non-transparent dielectric material and can include a section of a printed circuit board. An optoelectronic component can be attached to the respective constituent of the optical device or elsewhere to the optical device.

Such an optical device can be particularly well manufacturable and/or be particularly small. It may function as a waveguide and/or function otherwise, e.g., as a light sensor and/or as a light emitter.

More particularly, the optical device has a main direction, and the optical device includes a first, a second, a third and a fourth side panel, the first and third side panels being mutually parallel, and the second and fourth side panels being mutually parallel, and the main direction being aligned parallel to the first, to the second, to the third and to the fourth side panels, and the first and third side panels being at a right angle with respect to the second and fourth side panels;

a first prism body comprising two base faces aligned parallel to the first and third side panels, one attached to the first side panel, the other attached to the third side panel;

a second prism body comprising two further base faces aligned parallel to the first and third side panels, one attached to the first side panel, the other attached to the third side panel;

a cavity enclosed between the first, second, third and fourth side panels and the first and second prism bodies;

the first prism body comprising a first side face adjoining the cavity;

the second prism body comprising a second side face adjoining the cavity;

a first reflector present at the first side face which is shaped and aligned for redirecting light propagating in the cavity along a first direction to propagate along a third direction or vice versa, in particular wherein the third direction corresponds to the main direction;

a second reflector present at the second side face which is shaped and aligned for redirecting light propagating in the cavity along the third direction to propagate along a second direction or vice versa;

wherein at least one constituent of the optical device is at least in part made of a non-transparent dielectric material, wherein said at least one constituent is one of the first side panel, the second side panel, the third side panel, the fourth side panel, the first prism body, the second prism body.

The use of non-transparent dielectric material can contribute to the cost-efficiency of the manufacture of the optical devices, in particular if glass would otherwise be used. And it can reduce an amount of stray light emitted from or entering the optical device. Furthermore, the use of non-transparent dielectric material can facilitate mounting optoelectronic components at the optical device and in particular inside the optical device, more particularly inside the cavity, as will be described in more detail below.

The non-transparent dielectric material may be, e.g., a polymer-based material.

The non-transparent dielectric material may be a fiber reinforced material.

For example, the non-transparent dielectric material may be a printed circuit board base material.

It can be provided that each of the side panels is bonded to both of the prism bodies, e.g., using a bonding agent such as a glue, e.g., a curable epoxy. This can simplify the manufacturing process.

The cavity can be hermetically sealed by the side panels and the prism bodies, for example. This way, it can be avoided that an optical path inside the cavity is influenced or impaired by debris entering the cavity.

In some embodiments, each of the side panels is plate shaped having two opposing mutually parallel rectangularly shaped large sides and four small sides adjoining the two large sides each. This can simplify the manufacturing process.

The prism bodies may be prism shaped.

In some embodiments, outer walls of the optical device are established by the prism bodies and the side panels. This way, particularly small optical devices may be manufacturable in a particularly simple way.

In some embodiments, the first side face is aligned parallel to the second side face.

In some embodiments, the first direction is at an angle with the main direction, wherein that angle may be, e.g., between 30° and 60°, such as 45°±10° or even 45°±5°.

In some embodiments, the second direction is at an angle with the main direction, wherein that angle may be, e.g., between 30° and 60°, such as 45°±10° or even 45°±5°.

The first direction may be an incidence direction along which light propagates when entering the optical device and/or entering the cavity.

The second direction may be an exit direction along which light propagates when exiting the optical device and/or exiting the cavity.

In some embodiments, the optical device is an optical light guide element for guiding light incident on the optical light guide element along the incidence direction and exiting the optical light guide element along the exit direction inside the optical light guide element between the two reflectors, in particular for guiding the light along the main direction.

In some embodiments, the first direction is at a right angle with the main direction.

In some embodiments, the second direction is at a right angle with the main direction.

In some embodiments, the first direction is parallel to the second direction.

In some embodiments, the at least one constituent includes at least one electrically conductive via for establishing an electrical connection through the non-transparent dielectric material across the at least one constituent. This way, one or more optoelectronic components may be present inside the cavity while it is possible to control them and/or supply them with electric power from outside the optical device.

In some embodiments, the at least one constituent is at least in part constituted by a section of a printed circuit board (PCB). PCB material such as FR4/G10 or polyimide is relatively well machinable and available at relatively low prices. And it makes possible to integrate optoelectronic devices in the optical device and more particularly to have the opto-electronic component inside the optical device, e.g., inside the cavity.

In some embodiments, the optical device includes an optoelectronic component attached to the constituent. E.g., an optoelectronic component may be present at the first or at the second side face. And/or an optoelectronic component may be present at the second or at the fourth side panel, in particular inside the cavity.

In some embodiments, the constituent includes at least one electrically conductive contact pad, and wherein the optoelectronic component is attached to the contact pad and in electrical contact with the contact pad.

In some embodiments, the optical device has an outer side and includes at least one electrical contact at the outer side, wherein the optoelectronic component is electrically connected to the electrical contact (e.g., a contact pad). This way, an optoelectronic component may be present inside the cavity while it is possible to control it and/or supply it with electric power from outside the optical device. And it is possible to provide that the optical device is mountable to an external printed circuit board, e.g., in surface-mount technology.

In some embodiments, the optical device includes an optoelectronic component attached at one of the side panels.

In some embodiments, the optoelectronic component is mounted inside the cavity.

If the optoelectronic component is mounted at the first or the second prism body (more particularly at the first or second side face), it may be particularly simple to direct light produced by the optoelectronic component along a path related to (e.g., parallel to) a light path of light guided through the optical device and, respectively, to detect a higher portion of light guided through the optical device. On the other hand, the light path of light guided through the optical device may—deliberately or unintentionally—be influenced by such an opto-electronic component.

If the optoelectronic component is mounted at one of the side panels, the light path of light guided through the optical device may be less interfered with. On the other hand, it may be harder to direct light produced by the optoelectronic component along a path related to (e.g., parallel to) a light path of light guided through the optical device and, respectively, to detect a higher portion of light guided through the optical device.

If the optoelectronic component is mounted at the second or fourth side panel, it may be easier to direct light produced by the optoelectronic component along a path related to (e.g., parallel to) a light path of light guided through the optical device than in case the optoelectronic component is mounted at the first or third side panel.

However, the statements above are not generally applicable and depend on the exact position and design of the respective optoelectronic component and possibly also on, e.g., the design and alignment of the first and second side faces and reflectors.

In some embodiments, at least one of the side panels has two opposing primary sides, a respective first one of the primary sides facing the cavity, a respective second one of the primary sides facing away from the cavity, wherein the optoelectronic component is mounted at the second primary side. The primary sides can be, e.g., identical with the above-mentioned large sides.

It can be provided that each of the side panels has two opposing primary sides, a respective first one of the primary sides facing the cavity, a respective second one of the primary sides facing away from the cavity, and the optoelectronic component is mounted at the second primary side of one of the side panels. The primary sides can be, e.g., identical with the above-mentioned large sides.

In such embodiments, the optoelectronic component may be mounted outside the cavity.

In some embodiments, the optoelectronic component is mounted on a substrate which is connected to the second primary side (of one of the side panels, in particular of the second or of the fourth side panel) at which the optoelectronic component is mounted, via a spacer for defining a distance between the substrate and second primary side at which the optoelectronic component is mounted (via the substrate and the spacer). The primary sides can be, e.g., identical with the above-mentioned large sides.

A desired distance can thus be selected by selecting the height of the spacer. Such a distance adjustment can be useful in particular when light emitted by or sensed by the optoelectronic component passes through a lens element of the optical device.

The optoelectronic component may include a light emitting component and/or a light sensing component. It may, in addition or alternatively, include a microelectromechanical system, in particular a micromirror array.

In some embodiments, the optoelectronic component includes a light emitting component for producing light to be emitted from the optical device in addition to light guided through the optical device.

The light emitting component may be, e.g., a light emitting diode or a laser such as VCSEL (vertical cavity surface emitting laser).

For example, the optical device can be designed to emit a superposition of light guided through the optical device and of light produced by a light emitting component of the optical device. The light guided through the optical device and the light produced by the light emitting component may, e.g., pass through one and the same passive optical component (in particular through a lens element) of the optical device. The light emitting component may be present, e.g., inside the optical device such as inside the cavity. The light emitting component may, e.g., be present at the first side face or at the second side face.

The light guided through the optical device may, e.g., enter the optical device along an incidence direction (e.g., the first direction), be redirected by the first reflector to propagate along, e.g., the main direction, then be redirected by the second reflector to propagate along an exit direction (e.g., the second direction), and then exit the optical device, e.g., through a transparent portion of the second or fourth side panel and/or through a passive optical component (in particular through a lens element) of the optical device which may be present at the second or fourth side panel.

In some embodiments, the optoelectronic component includes a light sensing component, e.g., for sensing light guided through the optical device, more particularly for sensing a fraction of the light guided through the optical device.

The light emitting component may be, e.g., a photodiode.

The light sensing component may be present, e.g., inside the optical device such as inside the cavity. The light sensing component may, e.g., be present at the first side face or at the second side face.

For example, the optical device may be designed such that light guided through the optical device may, e.g., propagate as described above. And a fraction of the guided light is detected by the light sensing component. That fraction may be, e.g., stray light originating from the guided light. Or that fraction may be a portion of the guided light beam, e.g., by providing that a fraction of the beam cross-section of the beam having entered the optical device illuminates the light sensing component.

In some embodiments, the first reflector includes a reflective coating present on the first side face.

In some embodiments, the first reflector includes at least one mirror element attached to the first side face.

In some embodiments, the second reflector includes a reflective coating present on the second side face.

In some embodiments, the second reflector includes at least one mirror element attached to the second side face.

The mirror element mentioned above can be, e.g., an optoelectronic component, in particular a microelectromechanical system, such as a micromirror array. However, it is also possible to provide that the optoelectronic component can be a static mirror (flat or curved).

In some embodiments, the first side panel is transparent or includes a transparent region, for letting pass through the first side panel light propagating along the first direction.

In some embodiments, the second side panel is transparent or includes a transparent region, for letting pass through the second side panel light propagating along the second direction.

In some embodiments, the optical device includes a passive optical component, e.g., a lens element, arranged at the second or at the fourth side panel. This can contribute to the efficiency or usability of the optical device. E.g., light entering the optical device and/or light exiting the optical device (but also light produced by the optical device) can be focussed or expanded (diverged) by the lens element, as desired.

E.g., the lens element can include a diffractive lens portion or a refractive lens portion or a diffractive-and-refractive lens portion.

In some embodiments, at least one of the first prism body and the second prism body is at least in part made of the non-transparent dielectric material, and, in particular is at least in part constituted by a section of a printed circuit board.

In some embodiments, at least one of the first side panel, the second side panel, the third side panel, the fourth side panel, is at least in part made of the non-transparent dielectric material, in particular is at least in part constituted by a section of a printed circuit board.

In some embodiments, the base faces of the first prism body and the further base faces of the second prism body are tetragons with two (and not more than two) neighboring right angles.

In some embodiments, the optical device has a shape of a rectangular cuboid.

In some embodiments, the first prism body and the second prism body each include two further side faces one of which being aligned parallel to and being attached to the second outer side panel, the other of which being aligned parallel to and being attached to the fourth outer side panel. The further side faces may in particular be of rectangular shape.

When referring to "light" in the present patent application, we most generally refer to electromagnetic radiation, and more particularly to electromagnetic radiation of the infrared, visible or ultraviolet portion of the electromagnetic spectrum.

When referring to a "passive optical component" in the present patent application, we refer to optical component redirecting light by refraction and/or diffraction and/or (internal and/or external) reflection such as a lens, a prism, a mirror (plane or curved), optical filter, or an optical system, wherein an optical system is a collection of such optical components possibly also comprising mechanical elements such as aperture stops, image screens, holders. A plane-parallel plate or layer is not considered a passive optical component.

For details concerning ways, in particular very efficient ways, of manufacturing optical devices of the described kind, it is referred to U.S. provisional application 62/079,080 filed on Nov. 13, 2014 (wherein during the manufacturing described therein, mirror elements and optoelectronic components could be placed on the "plate" mentioned therein before separating the "plate" into the "initial bars" mentioned therein; and/or the optoelectronic components could be placed on the "substrate" mentioned therein before attaching the "substrate" to the "bar arrangement" mentioned therein; and/or the optoelectronic components could be placed on the "further substrate" mentioned therein, before carrying out a separating step for obtaining the "optical light guide elements" mentioned therein or even before attaching the "further substrates" mentioned therein to the "prism bars" mentioned therein) and to the U.S. provisional application (number not yet known) filed on the same day as the present patent application, entitled "MANUFACTURE OF OPTICAL LIGHT GUIDES" and naming the same inventors as the present patent application, i.e., Nicola Spring, Markus Rossi, Hartmut Rudmann.

Further embodiments and advantages emerge from the dependent claims and the figures.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural changes may be made without departing from the scope of the present invention. The following description of example embodiments is, therefore, not to be taken in a limiting sense, and the scope of the present invention is defined by the appended claims.

Figures 2A, 2B:
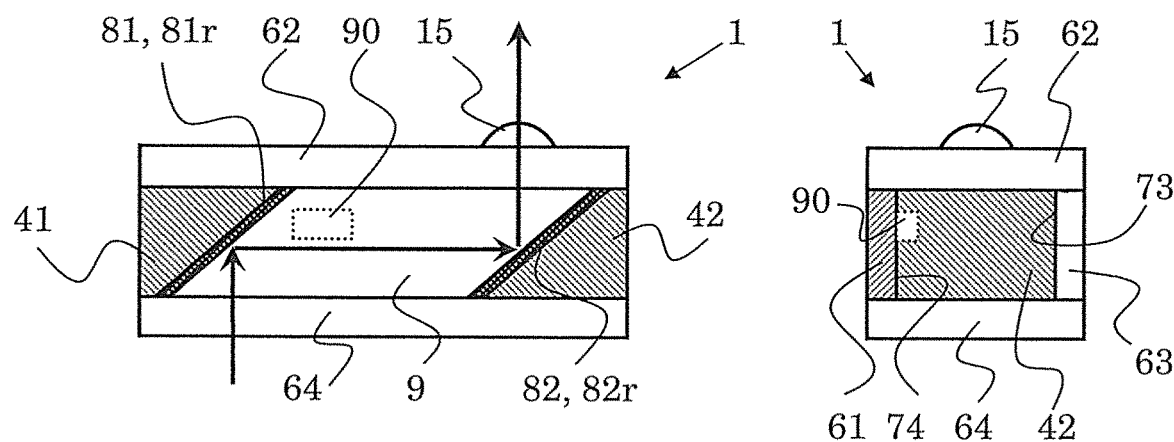
Figure 3:
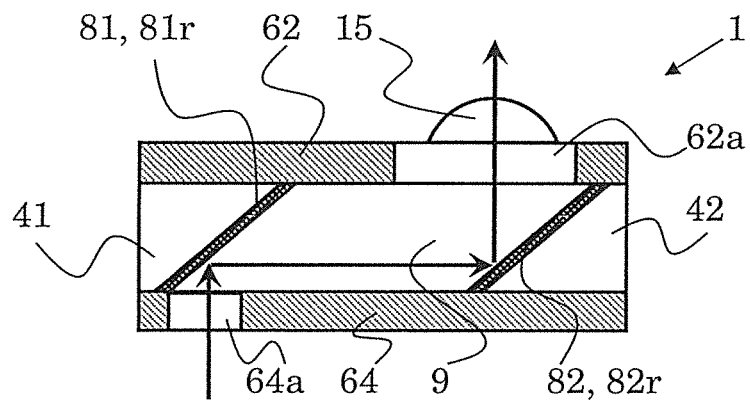
Figure 4:
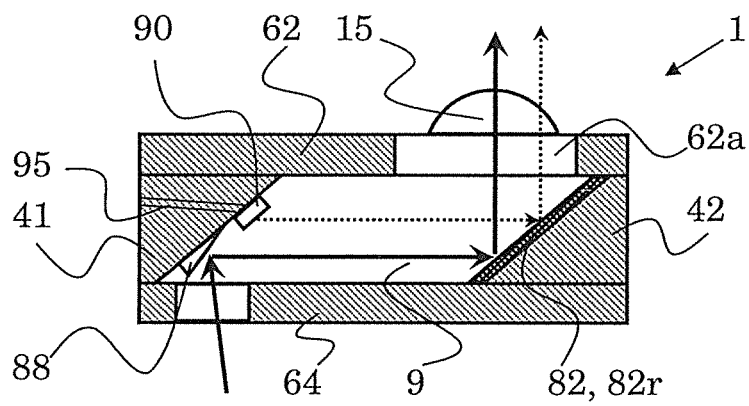
Figure 5:
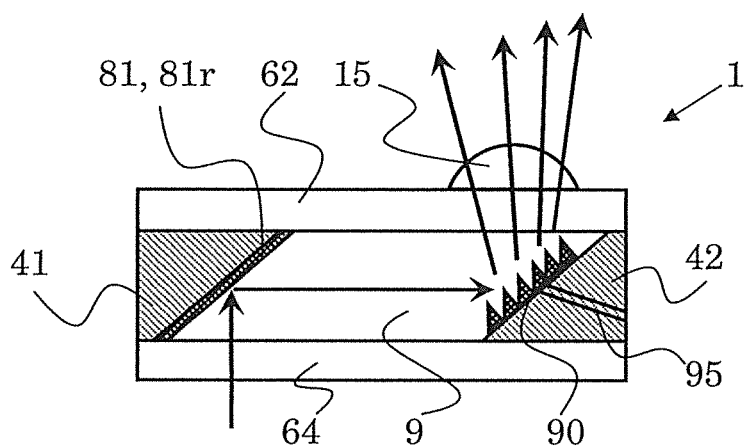
Figure 6:
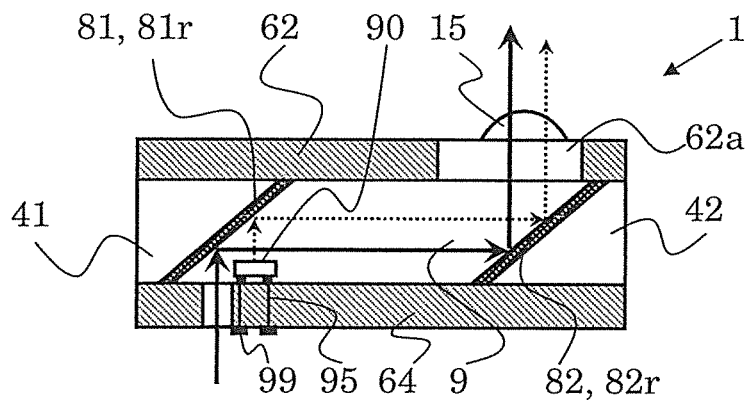
Figure 7:
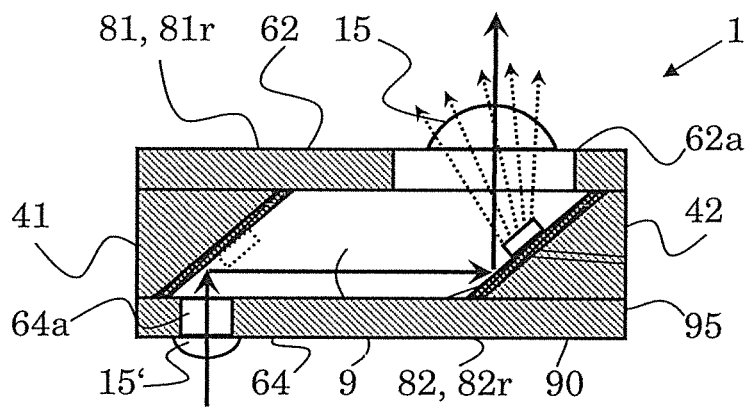
Figure 8:
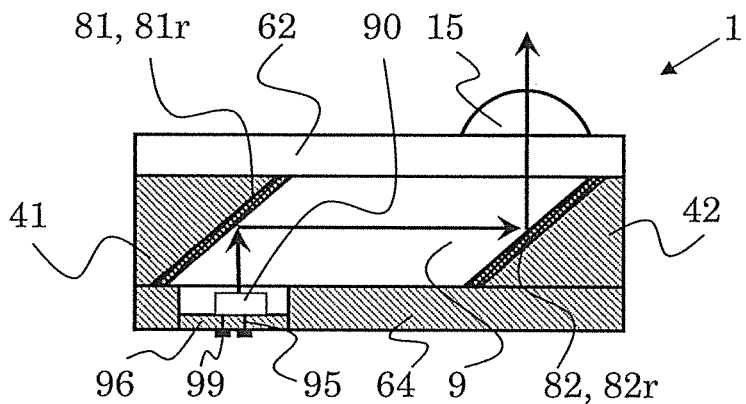
Figure 9:
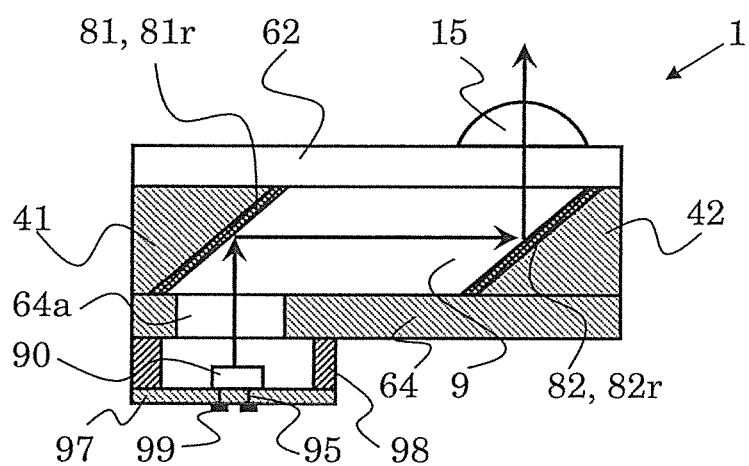

Below, the invention is described in more detail by means of examples and the included drawings. The figures show in a strongly schematized fashion:

FIG. 1 a perspective illustration of an optical device;

FIG. 2A a cross-sectional view of an optical device largely corresponding to the optical device of FIG. 1;

FIG. 2B a side view of the optical device of FIG. 2;

FIG. 3 a cross-sectional view of an optical device with side panels with transparent portions;

FIG. 4 a cross-sectional view of an optical device with an optoelectronic component and a mirror element;

FIG. 5 a cross-sectional view of an optical device with an optoelectronic component which is a MEMS;

FIG. 6 a cross-sectional view of an optical device with an optoelectronic component mounted inside the cavity on a side panel;

FIG. 7 a cross-sectional view of an optical device with an optoelectronic component mounted inside the cavity on a side face of a prism body;

FIG. 8 a cross-sectional view of an optical device with an optoelectronic component mounted on a substrate in a side panel;

FIG. 9 a cross-sectional view of an optical device with an optoelectronic component mounted on a substrate attached at a side panel via a spacer.

The described embodiments are meant as examples or for clarifying the invention and shall not limit the invention.

FIG. 1 is a perspective illustration of an optical device 1 with light guide properties which can be manufactured with high precision on wafer level.

FIGS. 2A and 2B are a cross-sectional view and a side view, respectively, of an optical device 1 largely corresponding to the optical device 1 of FIG. 1. Basically, the dimensions of the constituents of the optical device 1 are different, and in FIG. 1, an optoelectronic component 90 illustrated in FIGS. 2A, 2B is not illustrated in FIG. 1.

Optical device 1 includes two prism bodies 41, 42 and four side panels 61, 62, 63, 64 which enclose a cavity 9. These constituents 41, 42, 61, 62, 63, 64 are bonded to each other where they are adjacent to each other (cf. FIGS. 1, 2A, 2B), by means of a bonding agent such as a curable epoxy. This way, cavity 9 is hermetically closed such that contaminants cannot enter cavity 9.

On side panel 62, a lens element 15 is provided, e.g., as illustrated, a concave refractive half-lens.

Base faces 71, 72, 73, 74 of the prisms 41, 42 are of tetragon shape with two right angles and one acute and one obtuse angle. On mutually opposing side faces 81, 82 of prisms 41, 42, reflective coatings 81r and 82r, respectively, are provided, such that optical device 1 can function as a light guide (cf. the arrows in FIG. 2A): Light (a beam of light) can enter optical device 1 and cavity 9 through side panel 64 while propagating along an incidence direction), be reflected at reflective coating 81 to propagate along a main direction with respect to which the side panels are arranged in parallel, be reflected at reflective coating 82 to propagate along an exit direction and then to exit cavity 9 and optical device 1 through side panel 62 and lens element 15.

Faces 81, 82 may be aligned parallel to each other and, e.g., may be aligned at 45°±10° with respect to the main direction.

In cavity 9 at one of constituents 41, 42, 61, 62, 63, 64, an optoelectronic component 90 such a light sensing device, e.g., a photodiode, is provide. In FIGS. 2A, 2B, optoelectronic component 90 is mounted on side panel 61. Depending on the position of optoelectronic component 90, it may detect a fraction of light guided through optical device 1 or detect stray light. As an alternative, optoelectronic component 90 can be a light emitter such as an LED (cf. further examples below), e.g., for producing light superposing with light guided through optical device 1.

At least one of constituents 41, 42, 61, 62, 63, 64 is at least in part made of a non-transparent dielectric material, such of a printed circuit board (PCB) base material, e.g., FR4/G10 or polyimide or another polymer-based material. More specifically, at least one of constituents 41, 42, 61, 62, 63, 64 includes a PCB (or a section of a PCB). This will usually apply at least those ones of the constituents 41, 42, 61, 62, 63, 64 at which an optoelectronic component 90 is attached. However, this may apply also other ones of the constituents 41, 42, 61, 62, 63, 64 (cf. further examples below). Transparent portions may be provided adjacent to and possibly surrounded by the non-transparent dielectric material so as to provide defined areas for light passing through the respective constituent (cf. further examples below). Such transparent portions may, e.g., be made of a transparent solid material such as a transparent polymer.

Other ones of the constituents 41, 42, 61, 62, 63, 64 may be made of, e.g., a transparent material such as glass or a transparent polymer (cf. further examples below).

With electrical conductors ("vias") extending across the respective constituent present, optoelectronic components 90 can be electrically powered and/or controlled from outside optical device 1.

FIGS. 3 to 9 are illustrations in a side view of various exemplary configurations of optical devices 1, mainly for highlighting some specific details each. Details or features present in the respective Figure which are not specifically related to those specifically discussed details may alternatively be embodied in a different manner, e.g., as described elsewhere in the present patent application such as in another one of the Figures.

In the same manner as in FIGS. 2A, 2B, non-transparent material is illustrated by hatching, while transparent material is drawn in white. The meaning of reference symbols already explained before is sometimes not specifically repeated anymore.

FIG. 3 illustrates an optical device 1 with transparent portions 62a and 64a in side panels 62 and 64, respectively. An amount of stray light entering or exiting optical device 1 can be reduced by the use of non-transparent material. But regions where light may enter or exit optical device 1 can be defined by the transparent portion.

FIG. 4 illustrates an optical device 1 in which a mirror element 88 replaces a reflective coating on a side face (presently on side face 81). Such a mirror element 88 may be bonded to side face 81.

Furthermore, FIG. 4 illustrates an optical device 1 with an optoelectronic component 90 present on side face 81. Optoelectronic component 90 may be a light sensing device or, as illustrated in FIG. 4, a light emitting device, e.g., an LED or a laser. Electrical connections across prism body 41 are symbolized at 95.

FIG. 5 illustrates an optical device 1 with an optoelectronic component 90 which is a MEMS (microelectromechanical system) such as an array of actuable mirrors.

FIG. 6 illustrates an optical device 1 with a light emitter as optoelectronic component 90 mounted inside cavity 9 on side panel 64. This is another way of letting light produced by optical device 1 propagate along a path similar to (in particular parallel to) the path of light guided through optical device 1.

FIG. 6 also illustrates that at both large sides of a side panel (illustrated in FIG. 6: side panel 64), contact pads 99 may be present, for electrically contacting and mounting the optoelectronic component 90 and for providing electrical connections to optoelectronic component 90 from outside optical device 1, respectively.

FIG. 7 illustrates an optical device 1 with an optoelectronic component 90 mounted inside the cavity on side face 82 of prism body 42. This can be understood as an example for the possibility to produce a superposition of diffuse light (produced by optical device 1) and directed light (guided through optical device 1).

FIG. 7 also illustrates that more than one passive optical component may be included in optical device 1. E.g., one (15) may be present at a side panel (62) through which light exits optical device 1, and another one (15') may be present at a side panel (64) through which light enters optical device 1.

FIG. 8 illustrates an optical device 1 with an optoelectronic component 90 mounted on a substrate 96 in a side panel (presently: side panel 64). This can provide improved possibilities for adjusting an optical path length for light propagating between optoelectronic component 90 and lens element 15.

FIG. 9 illustrates an optical device 1 with an optoelectronic component 90 mounted on a substrate 95 attached at a side panel (64) via a spacer 98. This can provide improved possibilities for adjusting an optical path length for light propagating between optoelectronic component 90 and lens element 15.

In such embodiments, transparent portion 64a may simply be an opening instead of being made of a solid transparent material such as a transparent polymer.

The invention claimed is:

1. An optical device having a main direction, the optical device comprising
 a first, a second, a third and a fourth side panel, the first and third side panels being mutually parallel, and the second and fourth side panels being mutually parallel, and the main direction being aligned parallel to the first, to the second, to the third and to the fourth side panels, and the first and third side panels being at a right angle with respect to the second and fourth side panels;
 a first prism body comprising two base faces aligned parallel to the first and third side panels, one attached to the first side panel, the other attached to the third side panel;
 a second prism body comprising two further base faces aligned parallel to the first and third side panels, one attached to the first side panel, the other attached to the third side panel;
 a cavity enclosed between the first, second, third and fourth side panels and the first and second prism bodies;
 the first prism body comprising a first side face adjoining the cavity;
 the second prism body comprising a second side face adjoining the cavity;
 a first reflector present at the first side face which is shaped and aligned for redirecting light propagating in the cavity along a first direction to propagate along the main direction or vice versa;
 a second reflector present at the second side face which is shaped and aligned for redirecting light propagating in the cavity along the main direction to propagate along a second direction or vice versa;
 wherein at least one constituent of the optical device is at least in part made of a non-transparent dielectric material, wherein said at least one constituent is one of the first side panel, the second side panel, the third side panel, the fourth side panel, the first prism body, the second prism body.

2. The optical device according to claim 1, wherein the at least one constituent comprises at least one electrically conductive via for establishing an electrical connection through the non-transparent dielectric material across the at least one constituent.

3. The optical device according to claim 1, wherein the at least one constituent is at least in part constituted by a section of a printed circuit board.

4. The optical device according to claim 1, comprising an optoelectronic component.

5. The optical device according to claim 4, wherein the optoelectronic component is attached to the constituent.

6. The optical device according to claim 5, wherein the constituent comprises at least one electrically conductive contact pad, and wherein the optoelectronic component is attached to the contact pad.

7. The optical device according to claim 5, having an outer side and comprising at least one electrical contact at the outer side, wherein the optoelectronic component is electrically connected to the electrical contact.

8. The optical device according to claim 4, at least one of the side panels having two opposing primary sides, a respective first one of the primary sides facing the cavity, a respective second one of the primary sides facing away from the cavity, wherein the optoelectronic component is mounted at the second primary side.

9. The optical device according to claim 8, wherein the optoelectronic component is mounted on a substrate which is connected to the second primary side at which the optoelectronic component is mounted, via a spacer for defining a distance between the substrate and second primary side at which the optoelectronic component is mounted.

10. The optical device as in claim 4, in which the optoelectronic component comprises a light emitting component.

11. The optical device as in claim 4, in which the optoelectronic component comprises a light sensing component.

12. The optical device as in claim 4, in which the optoelectronic component comprises a microelectromechanical system.

13. The optical device according to claim 12, wherein the microelectromechanical system comprises a micromirror array.

14. The optical device as in claim 1, in which the first reflector comprises a reflective coating present on the first side face or wherein the first reflector comprises at least one mirror element attached to the first side face.

15. The optical device as in claim 14, in which the second reflector comprises a reflective coating present on the second side face or wherein the second reflector comprises at least one mirror element attached to the second side face.

16. The optical device according to claim 15, wherein the mirror element is an optoelectronic component.

17. The optical device according to claim 16, wherein the mirror element is a microelectromechanical system.

18. The optical device according to claim 16, wherein the microelectromechanical system comprises a micromirror array.

19. The optical device as in claim 1, in which the first side panel is transparent or comprises a transparent region, for letting pass through the first side panel light propagating along the first direction.

* * * * *